United States Patent
Ge et al.

(10) Patent No.: US 10,727,256 B2
(45) Date of Patent: Jul. 28, 2020

(54) METHOD FOR FABRICATING ARRAY SUBSTRATE, ARRAY SUBSTRATE AND DISPLAY

(71) Applicant: HKC CORPORATION LIMITED, Shenzhen, Guanggong (CN)

(72) Inventors: Bangtong Ge, Guanggong (CN); Tingting Fu, Guanggong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 16/313,022

(22) PCT Filed: Nov. 29, 2018

(86) PCT No.: PCT/CN2018/118055
§ 371 (c)(1),
(2) Date: Dec. 22, 2018

(87) PCT Pub. No.: WO2020/082501
PCT Pub. Date: Apr. 30, 2020

(65) Prior Publication Data
US 2020/0135767 A1 Apr. 30, 2020

(30) Foreign Application Priority Data
Oct. 24, 2018 (CN) .......................... 2018 1 1243352

(51) Int. Cl.
*H01L 27/12* (2006.01)
*H01L 21/027* (2006.01)
(Continued)

(52) U.S. Cl.
CPC .......... *H01L 27/127* (2013.01); *G02F 1/1368* (2013.01); *H01L 21/0262* (2013.01);
(Continued)

(58) Field of Classification Search
CPC ............... H01L 27/127; H01L 21/3081; H01L 21/32134; H01L 21/0262; H01L 21/02592;
(Continued)

(56) References Cited

U.S. PATENT DOCUMENTS 6,486,010 B1 * 11/2002 Hsu .................. H01L 29/66765
257/E21.414
2007/0242203 A1 * 10/2007 Lee ................... G02F 1/134363
349/141
(Continued)

FOREIGN PATENT DOCUMENTS

CN 101435965 A 5/2009
CN 107464820 A 12/2017
(Continued)

OTHER PUBLICATIONS

Yan Bae, the ISA written comments, Jul., 2019, CN.
Yan Bai, the International Search Report, Jul. 2019. CN.

*Primary Examiner* — Thanh T Nguyen

(57) ABSTRACT

A method for fabricating an array substrate, after the wet etching process of the source-drain metal layer (17), performs first ashing for the island-like photoresist pattern (19), such that the edge of the island-like photoresist pattern (19) is aligned with the edge of the source-drain metal segment (171).

16 Claims, 7 Drawing Sheets

(51) Int. Cl.
  *H01L 21/3065* (2006.01)
  *H01L 21/308* (2006.01)
  *H01L 21/3213* (2006.01)
  *H01L 21/02* (2006.01)
  *H01L 29/786* (2006.01)
  *H01L 29/45* (2006.01)
  *H01L 29/40* (2006.01)
  *H01L 29/417* (2006.01)
  *G02F 1/1368* (2006.01)
  *H01L 29/66* (2006.01)

(52) U.S. Cl.
  CPC .... *H01L 21/0273* (2013.01); *H01L 21/02532* (2013.01); *H01L 21/02592* (2013.01); *H01L 21/3065* (2013.01); *H01L 21/3081* (2013.01); *H01L 21/32134* (2013.01); *H01L 27/1222* (2013.01); *H01L 27/1288* (2013.01); *H01L 29/401* (2013.01); *H01L 29/41733* (2013.01); *H01L 29/458* (2013.01); *H01L 29/66765* (2013.01); *H01L 29/78669* (2013.01); *H01L 29/78696* (2013.01); *G02F 2202/103* (2013.01)

(58) Field of Classification Search
  CPC . H01L 29/458; H01L 27/1288; H01L 29/401; H01L 21/3065; H01L 29/66765; H01L 21/0273; H01L 29/78669; H01L 21/02532; H01L 29/78696; H01L 27/1222; H01L 29/41733; G02F 1/1368; G02F 2202/103
  See application file for complete search history.

(56) References Cited

U.S. PATENT DOCUMENTS

| | | | |
|---|---|---|---|
| 2012/0028421 A1* | 2/2012 | Yang | H01L 21/32138 438/158 |
| 2015/0171111 A1* | 6/2015 | Hong | H01L 29/66969 257/43 |

FOREIGN PATENT DOCUMENTS

| | | |
|---|---|---|
| CN | 107634035 A | 1/2018 |
| CN | 108417563 A | 8/2018 |
| CN | 108447821 A | 8/2018 |

\* cited by examiner

METHOD FOR FABRICATING ARRAY SUBSTRATE, ARRAY SUBSTRATE AND DISPLAY

CROSS-REFERENCE TO RELATED APPLICATIONS

This application is the International Application No. PCT/CN2018/118055 for entry into US national phase with an international filing date of Nov. 29, 2018, designating US, now pending, and claims priority to Chinese Patent Application No. 201811243352.4, filed on Oct. 24, 2018, the content of which is incorporated herein by reference in its entirety.

BACKGROUND OF THE APPLICATION

Field of the Invention

The present application relates to the technical field of displays, and particularly relates to a method for fabricating an array substrate, an array substrate and a display.

Description of Related Art

The liquid crystal display (LCD) panel is an important component of a liquid crystal display, which usually includes a color filter substrate (CF substrate) and a thin film transistor array substrate (TFT substrate) disposed oppositely, and a liquid crystal layer disposed between the two substrates. The array substrate is provided with scan lines and data lines crossing with each other to define a plurality of pixel cells, and the TFTs are turned on or turned off according to signals of the scan lines, so as to transmit the signals of the data lines to the pixel cells. The liquid crystal molecules of the liquid crystal layer will rotate according to different data voltage signals, to transmit or block light, thus refracting the light provided by the backlight component to form images corresponding to the data signals.

In the fabrication of a bottom gate TFT, the gate electrode, the gate insulating layer, the active layer, and the source-drain layer include a lithography process. A current method proposed for saving processes is to form a source-drain electrode and an active layer through a halftone lithography process, in which a wet etching method is firstly applied to perform wet etching the source-drain metal layer by using a photosensitive material layer as a mask, and then dry etching is performed for the active layer under the source-drain metal layer by using the photosensitive material layer as the mask. Since the wet etching has a characteristic of isotropy, the lateral etching length of the source-drain metal layer is close to the vertical etching depth of the source-drain metal layer, resulting in that the source-drain metal layer is indented a distance relative to the photosensitive material layer. Further, the active layer after dry etching and the photosensitive material layer have substantially same length, thus causing the active layer to protrude a distance relative to the source-drain metal layer, which is referred to as a tail of the active layer. Due to the tail, the active layer has a distance that, from the backlight direction, cannot be blocked by the gate electrode, and has a distance from the positive light direction that cannot be blocked by the source-drain electrode. The light from the backlight and the light reflected by one side of the liquid crystal layer are irradiated onto the active layer to generate a light leakage current. The larger the length of the tail, the larger the light leakage current, which causes the pixel voltage to change and the best gamma common voltage (Best Vcom) unstable, thus causing flickering and image sticking of frames, and ultimately reducing the displaying quality of the frames.

BRIEF SUMMARY OF THE APPLICATION

The purpose of the present application is to provide a method for fabricating an array substrate, which includes but not limited to solving the technical problem that the tail of the active layer is too large to cause a light leakage current.

To solve the above technical problem, the technical solutions adopted by the embodiments of the present application are that: a method for fabricating an array substrate, which includes:

providing a substrate base layer, forming a gate electrode on the substrate base layer, and forming a gate insulating layer on the gate electrode and the substrate base layer;

sequentially forming a semiconductor material layer and a source-drain metal layer on the gate insulating layer, and forming an island-like photoresist pattern on the source-drain metal layer, wherein the island-like photoresist pattern includes a first portion and a second portion disposed on both sides of the first portion, and the height of the second portion is greater than the height of the first portion; wherein the source-drain metal layer is first wet etched by using the island-like photoresist pattern as a mask, so as to obtain a source-drain metal segment;

performing first ashing for the island-like photoresist pattern, such that the edge of the island-like photoresist pattern is aligned with the edge of the source-drain metal segment;

performing first dry etching for the semiconductor material layer by using the island-like photoresist pattern after first ashing as a mask, so as to obtain an active segment portion;

performing second ashing for the island-like photoresist pattern after first ashing, so as to remove the first portion, and obtain third portions disposed at intervals, wherein the height of the third portions are less than the height of the first portion; and performing second wet etching for the source-drain metal segment by using the third portions as a mask, so as to obtain a source electrode and a drain electrode.

The semiconductor material layer includes an amorphous silicon layer and a doped layer formed on the amorphous silicon layer; and the active segment portion includes an amorphous silicon segment and a doped segment disposed on the amorphous silicon segment.

The doped layer is an amorphous silicon layer doped with an n-type element.

The amorphous silicon layer has a thickness of 1000 to 4000 angstroms, and the doped layer has a thickness of 300 to 1000 angstroms.

After obtaining the source electrode and the drain electrode, the method further includes performing second dry etching for the doped segment, so as to obtain an ohmic contact layer disposed on both sides of the amorphous silicon segment.

The amorphous silicon layer is deposited on the gate insulating layer by chemical vapor deposition, and the doped layer is deposited on the gate insulating layer by chemical vapor deposition.

The first dry etching further includes a method for increasing a ratio of rates of longitudinal etching and lateral etching.

The method for increasing a ratio of rates of longitudinal etching and lateral etching includes at least one of the following steps:

reducing a ratio of a flow rate of an etching reaction gas; improving an etching power; and reducing etching gas pressure, and reducing concentration of reaction gas in an etching chamber.

The first ashing uses a mixed gas of oxygen and a fluorine-containing gas, and the fluorine-containing gas includes at least one of NF3, CF4, C2F6, C4F8, CHF3, and SF6.

The second ashing uses a mixed gas of oxygen and a fluorine-containing gas, and the fluorine-containing gas includes at least one of NF3, CF4, C2F6, C4F8, CHF3, and SF6.

The material of the source-drain metal layer is at least one of chromium, molybdenum, copper, titanium, aluminum or molybdenum nitride.

The source-drain metal layer is a Mo/Al/Mo layer, a MoN/Al/Mo layer, or a Mo/Al/MoN layer.

The upper Mo layer or MoN layer has a thickness of 100-500 angstroms, the middle Al layer has a thickness of 2000-5500 angstroms, and the lower Mo layer or MoN layer has a thickness of 100-300 angstroms.

The time for the second wet etching does not exceed 150 seconds.

After the first wet etching, the edge of the source-drain metal segment is inwardly indented by a distance of 0.5-1.5 μm with respect to the edge of the island-like photoresist pattern.

After the second wet etching, the source electrode and the drain electrode obtained are inwardly indented by a distance of 0.5-1.5 μm with respect to the edge of the third portions.

Another purpose of the present application is to provide an array substrate, which includes an amorphous silicon segment, wherein a tail made of amorphous silicon of the amorphous silicon segment has a length of 1-1.6 μm.

The array substrate further includes an ohmic contact layer disposed on both sides of the amorphous silicon segment and disposed between a source electrode and a drain electrode, wherein the ohmic contact layer protrudes from the edges of the source electrode and the drain electrode by a length of 0.1 and 0.4 μm.

Still another purpose of the present application is to provide a display, which includes an array substrate, wherein the array substrate comprises a an amorphous silicon segment, and a source electrode and a drain electrode disposed on both sides of the amorphous silicon segment, wherein a tail made of amorphous silicon of the amorphous silicon segment has a length of 1-1.6 μm, the source electrode and the drain electrode are a Mo/Al/Mo layer, a MoN/Al/Mo layer, or a Mo/Al/MoN layer, and the upper Mo layer or MoN layer has a thickness of 100-500 angstroms, the middle Al layer has a thickness of 2000-5500 angstroms, and the lower Mo layer or MoN layer has a thickness of 100-300 angstroms.

The array substrate further includes an ohmic contact layer disposed on both sides of the amorphous silicon segment and disposed between a source electrode and a drain electrode, wherein the ohmic contact layer protrudes from the edges of the source electrode and the drain electrode by a length of 0.1 and 0.4 μm.

The method for fabricating an array substrate provided by embodiments of the present application makes the edge of the photoresist pattern aligned with the edge of the wet-etched source-drain metal layer through adding a first ashing process to portions of the photoresist pattern having different heights after the source-drain metal layer is first wet etched by a halftone mask, which enables the edge of the semiconductor material layer to be close to or even aligned with the edge of the source-drain metal layer when the semiconductor material layer under the source-drain metal layer is first dry etched, thereby reducing the length of the tail of the active layer, preventing both sides of the active layer from being irradiated by the light from the backlight direction or the light reflected by one side of the liquid crystal layer to generate light leakage current, thus ensuring the stability of pixel voltages and the quality of frame displaying. The tails of the amorphous silicon (a-Si tail) of the array substrate and the display are respectively reduced, thereby reducing the light leakage current, and ensuring the stability of pixel voltages and the stability of displaying frames.

BRIEF DESCRIPTION OF THE DRAWINGS

In order to more clearly illustrate the technical solutions in the embodiments of the present application, the drawings used in the description of the embodiments or the prior art will be briefly described below. Obviously, the drawings in the following description are only some embodiments of the present application, and other drawings may be obtained based on these drawings for those of ordinaries skilled in the art without inventive work.

DESCRIPTION OF THE EMBODIMENTS

Figure 1:
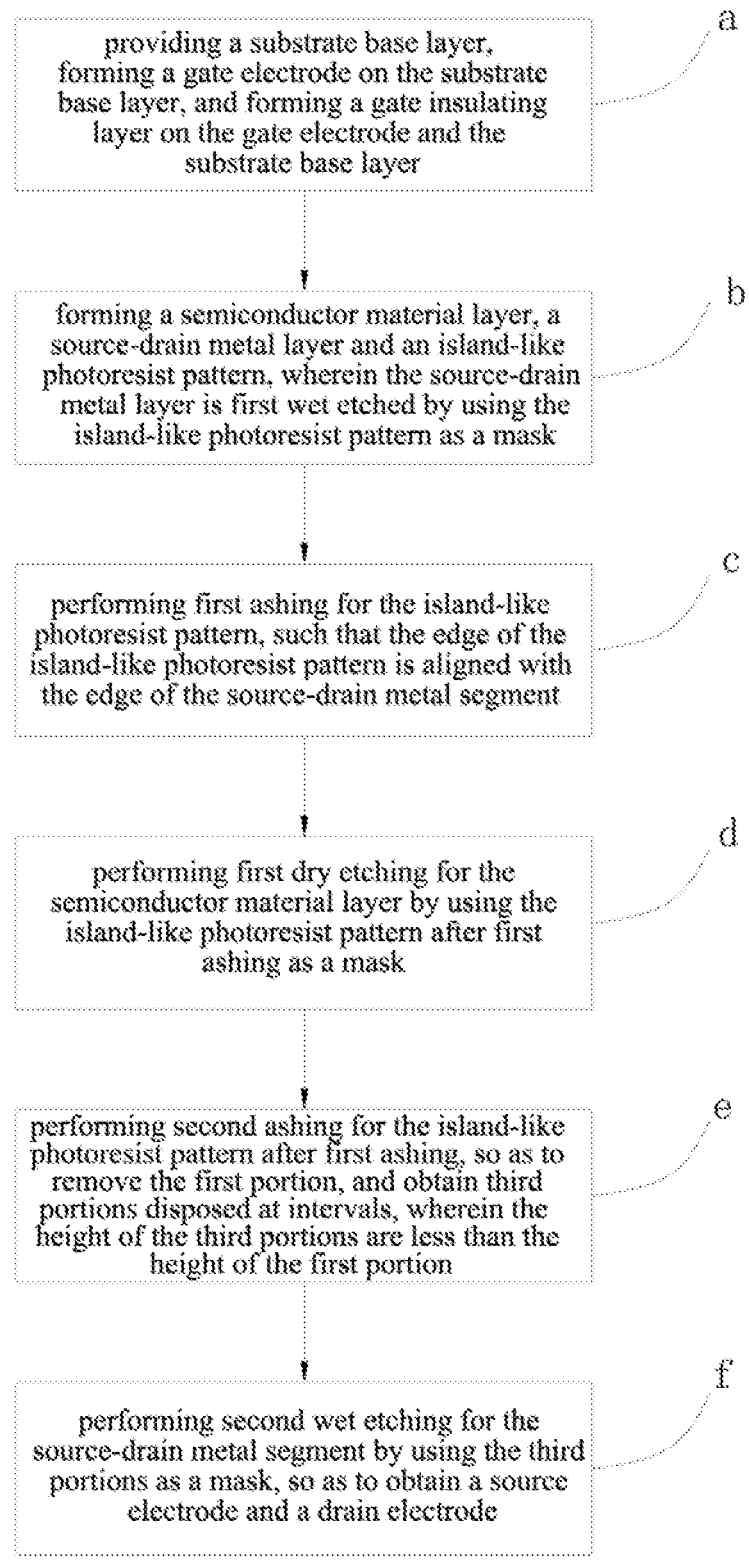
FIG. 1 is a flow chart of the method for fabricating an array substrate provided by an embodiment of the present application.

In order to make the purposes, the technical solutions and the advantages of the present application more clear, the present application will be further described in detail below with reference to the accompanying drawings and embodiments. It should be understood that, the specific embodiments described herein are merely illustrative of the application and are not intended to limit the application.

It should be noted that, when an element is referred to as being "fixed" or "disposed" to another element, the element may be directly on another element or indirectly on another element. When an element is referred to as being "connected" to another element, the element may be directly or indirectly connected to another element. The orientation and position relationship indicated by the terms "upper", "lower", "left", "right", "vertical", "horizontal" and the like are based on the orientation or position relationship as shown in the drawings, and are merely for convenience of description of the present application, and do not indicate or imply the indicated device or component must have a particular orientation, be constructed or operated in a particular orientation, and thus are not to be construed as limiting the present application. For those of ordinaries skilled in the art, the above terms may be understood according to specific situations. The terms "first" or "second" is merely used for descriptive purpose and is not to be construed as indicating or implying a relative importance or implicitly indicating the amount of technical features. "A plurality of" means two or more unless specifically defined otherwise.

Figure 2:
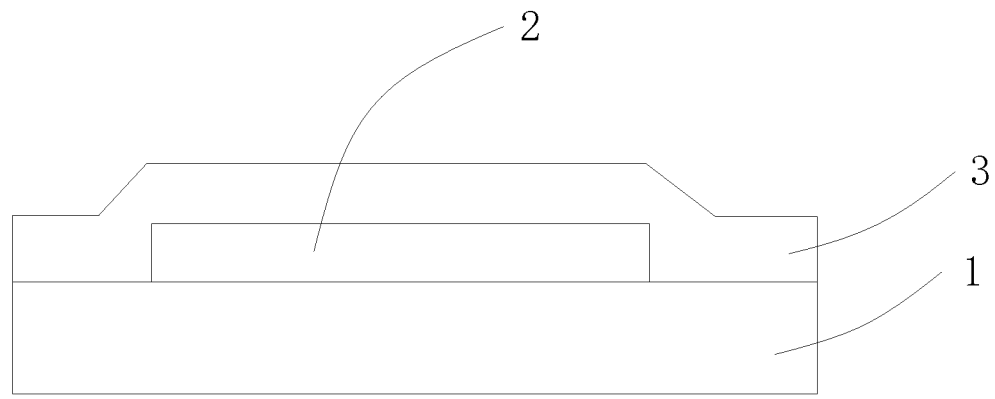
FIG. 2 is a schematic view of the step a of the method for fabricating an array substrate provided by an embodiment of the present application.

In order to illustrate the technical solutions of the present application, the present application will be described in detail below with reference to the accompanying drawings and embodiments. Please refer to FIGS. 1-7, the present application provides a method for fabricating an array substrate, which includes:

Step a, as shown in FIG. 2, providing a substrate base layer 1, forming a gate electrode 2 on the substrate base layer 1, and forming a gate insulating layer 3 on the substrate base layer 1 and the gate electrode 2.

Specifically, the substrate base layer 1 is a transparent base layer, such as a glass plate, a transparent plastic plate or the like.

A first metal material layer (not shown) is deposited on the substrate base layer 1 by sputtering or the like, and a first photoresist layer is formed on the first metal material layer, and the first photoresist layer is exposed through a first mask plate (not shown). The mask plate has hollow pattern regions (not shown) corresponding to a plurality of scanning lines and the gate electrode 2. When the ultraviolet light passes through the hollow pattern regions to expose the photosensitive material, and after development, the regions of the first photoresist layer corresponding to the scanning lines and the gate electrode 2 are retained, the other region is removed, and then the first metal material layer is wet etched by using the hollow pattern regions of the first photoresist layer as a mask, and the scan lines (not shown) and the gate electrode 2 are obtained at the same time.

The material of the first metal material layer may be chromium (Cr), molybdenum (Mo), copper (Cu), titanium (Ti), molybdenum/aluminum (Mo/Al) composite layer, or a composite layer of two or more metals such as molybdenum/aluminum/molybdenum (Mo/Al/Mo), etc. The first metal material layer has a thickness of 2000 to 8000 angstroms.

The gate insulating layer 3 is formed by chemical vapor deposition on the gate electrode 2 and the scanning lines. The material of the gate insulating layer 3 is at least one of silicon oxide (SiOx) and silicon nitride (SiNx), and the thickness of the gate insulating layer 3 is 1000-5000 angstroms.

Figure 3:
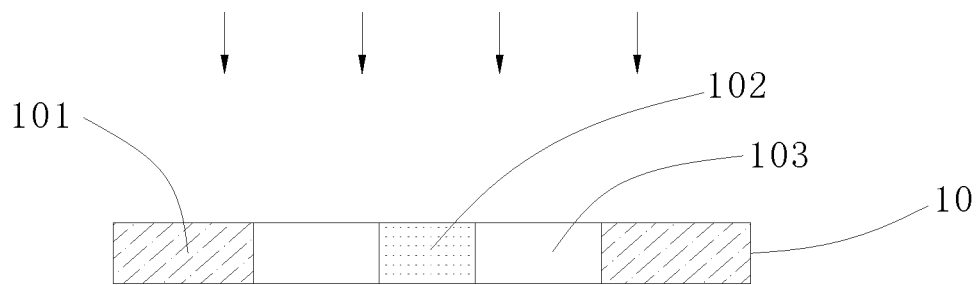
FIGS. 3 and 4 are schematic views of the step b of the method for fabricating an array substrate provided by an embodiment of the present application.
Figure 3:
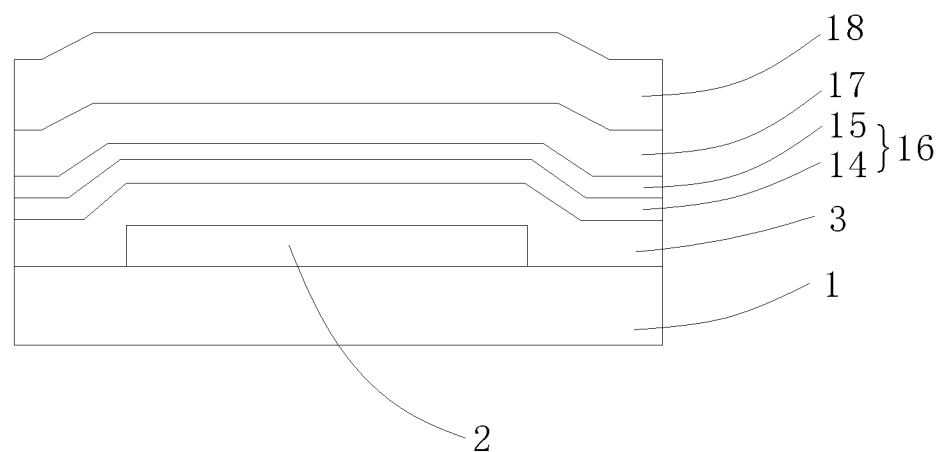
Figure 4:
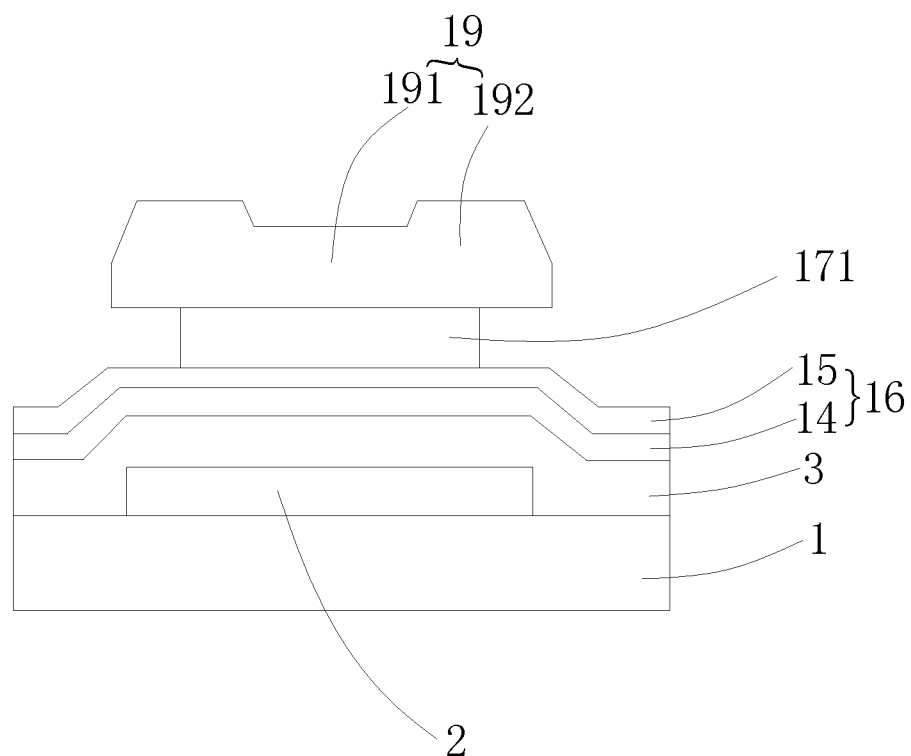

Step b, as shown in FIG. 3 and FIG. 4, sequentially forming an amorphous silicon layer 14, a doped layer 15, and a source-drain metal layer 17 on the gate insulating layer 3, and forming an island-like photoresist pattern 19 on the source-drain metal layer 17, and then performing a first wet etching for the source-drain metal layer 17 by using the island-like photoresist pattern 19 as a mask, wherein the island-like photoresist pattern 19 includes a first portion 191 and a second portion 192 disposed on both sides of the first portion 191, and the height of the second portion 192 is greater than the height of the first portion 191.

Specifically, the amorphous silicon layer 14 is deposited on the gate insulating layer 3 by chemical vapor deposition, and the doped layer 15 is deposited on the amorphous silicon layer 14 by chemical vapor deposition. The amorphous silicon layer 14 and the doped layer 15 collectively function as a semiconductor material layer 16.

In other embodiments, the semiconductor material layer 16 may also be formed by depositing the amorphous silicon layer 14 and performing ion doping for the amorphous silicon layer 14, while the lower part of the pure amorphous silicon layer 14 is not ion doped, and the upper part is doped with ions, which has good electrical conductivity, and will not be described herein again.

Specifically, in the present embodiment, the doped layer 15 is an N+ doped layer 15, for example, the doped layer 15 is formed by the amorphous silicon layer 14 doped with an n-type element such as B (boron), P (phosphorus) or As (arsenic) or the like.

The amorphous silicon layer 14 has a thickness of 1000 to 4000 angstroms, and the doped layer 15 has a thickness of 300 to 1000 angstroms.

The material of the source-drain metal layer 17 may be at least one of chromium (Cr), molybdenum (Mo), copper (Cu), titanium (Ti), aluminum (Al), or molybdenum nitride (MoN). In the present embodiment, the source-drain metal layer 17 is a Mo/Al/Mo layer, a MoN/Al/Mo layer or a Mo/Al/MoN layer, and the upper layer (the Mo layer or the MoN layer, away from the semiconductor material layer 6) has a thickness of 100-500 angstroms, the intermediate layer (the Al layer) has a thickness of 2000-5500 angstroms, and the lower layer (the Mo layer or the MoN layer, near the semiconductor material layer 6) has a thickness of 100-300 angstroms. On the one hand, Al has advantages of good electrical conductivity and low cost, and Mo material can effectively prevent diffusion of Al atoms into the amorphous silicon layer 14, further prevent generation of light leakage current, improve the electrical characteristics of the TFT, and prevent diffusion of Al to ITO (Indium Tin Oxide) transparent conductive layer, and prevent the performance of the transparent conductive layer from being affected.

The island-like photoresist pattern 19 is specifically formed by coating a second photoresist layer 18 on the source-drain metal layer 17 and providing a half-tone mask 10, wherein the half-tone mask 10 is provided with a fully photic zone, a semi-photic zone 102 and an opaque zone 101, after exposure and development, a portion of the second photoresist layer 18 corresponding to the fully photic zone 103 is remained and forms the first portion 191, a portion of the second photoresist layer 18 corresponding to the opaque zone 101 is removed, and a portion of the second photoresist layer 18 corresponding to the semi-photic zone 102 forms the second portion 192.

After the step b, the source-drain metal layer 17 is etched to obtain a source-drain metal segment 171 under the island-like photoresist pattern 19, and the edge of the source-drain metal segment 171 is inwardly indented relative to the edge of the island-like photoresist pattern 19, and the indentation distance is approximately 0.5-1.5 µm.

Figure 5:
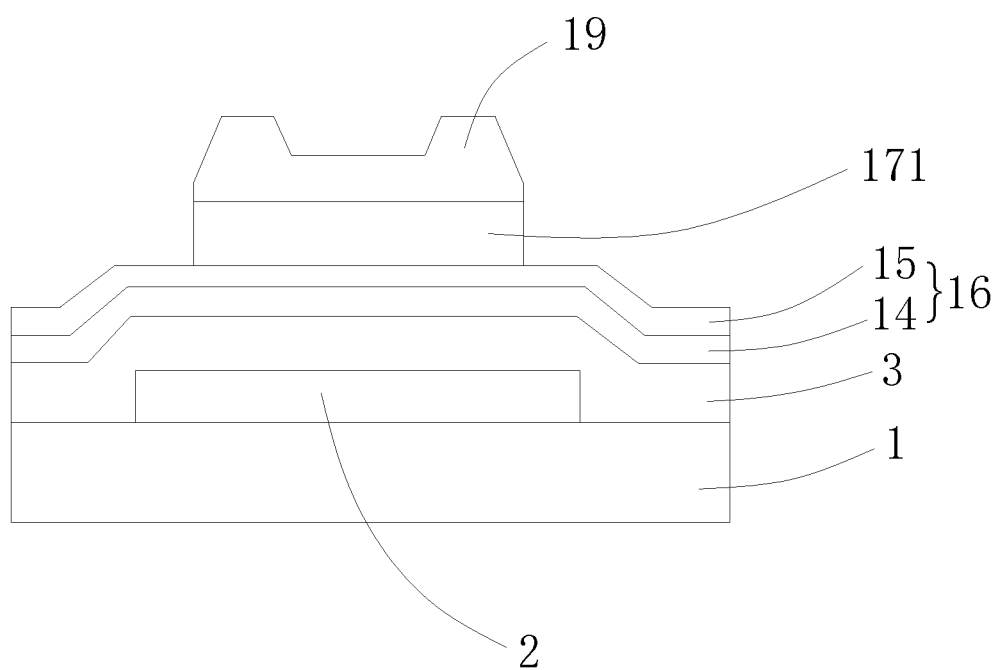
FIG. 5 is a schematic view of the step c of the method for fabricating an array substrate provided by an embodiment of the present application.

Step c, as shown in FIG. 5, performing first ashing for the island-like photoresist pattern 19, such that the edge of the island-like photoresist pattern 19 is aligned with the edge of the source-drain metal segment 171.

Specifically, the first ashing uses a mixed gas of oxygen and a fluorine-containing gas, and the fluorine-containing gas includes at least one of NF3, CF4, C2F6, C4F8, CHF3, and SF6. The mixed gas is ionized into a plasma by a radio frequency power source such as a high voltage discharge, and the island-like photoresist pattern 19 is etched by the plasma.

After the first ashing of the island-like photoresist pattern 19, the edge of the island-like photoresist pattern 19 is inwardly indented by a indentation distance of about 0.5 to 1.5 μm. At the same time, the heights of the first portion 191 and the second portion 192 are both reduced.

Figure 6:
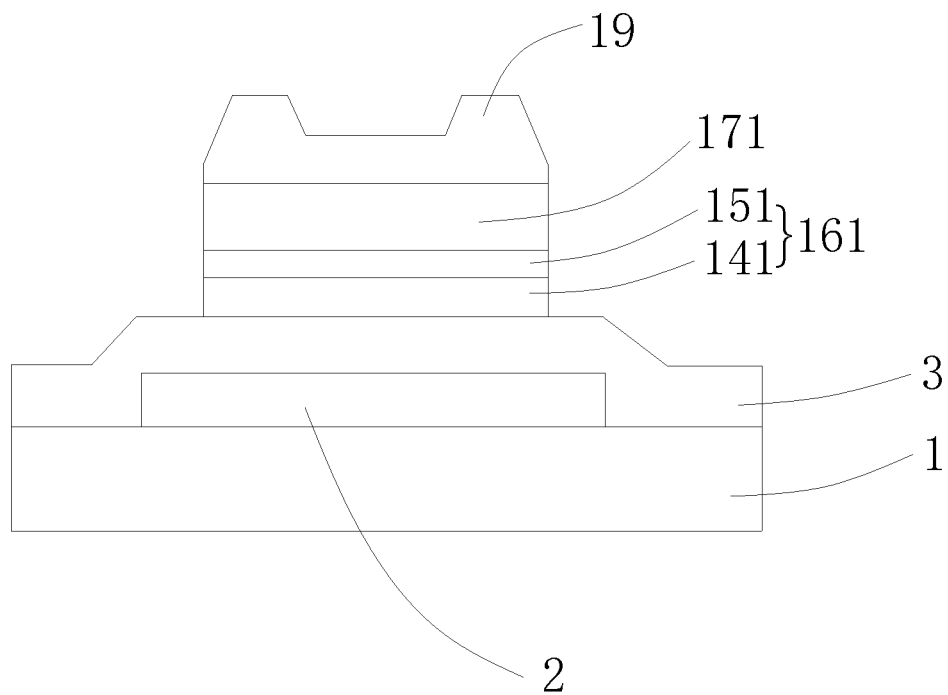
FIG. 6 is a schematic view of the step d of the method for fabricating an array substrate provided by an embodiment of the present application.

Step d, as shown in FIG. 6, performing first dry etching for the amorphous silicon layer 14 and the doped layer 15 by using the island-like photoresist pattern 19 after first ashing as a mask, so as to obtain an active segment portion 161 aligned with the edge of the source-drain metal segment 171, and the active segment portion 161 includes an amorphous silicon segment 141 aligned with the edge of the source-drain metal segment 171 and a doped segment 151 aligned with the edge of the amorphous segment.

The dry etching uses a vacuum gas to generate a gas plasma under the action of a high voltage power source, and the gas plasma only acts on the non-metal film layer, and does not etch the metal layer, thereby ensuring that the source-drain metal segment 171 is not affected.

During the dry etching process, the gas plasma bombards the surface of the layer to be etched, which is performed as longitudinal etching, and the gas plasma reacts with the layer to be etched to form a volatile substance, which is performed as lateral etching. As the longitudinal depth increases, the lateral etching capability gradually decreases. Therefore, the dry etching forms a curved recess on the surface of the layer to be etched, causing a small tilt angle (not shown) at the edge of the amorphous silicon segment 141 and the doped segment 151. It should be understood that, "alignment" herein does not necessarily mean vertical alignment, but rather refers to that the edge of the amorphous silicon segment 141 and the edge of the doped segment 151 have uniformity formed by dry etching based on the same mask.

In the step d, in order to make the edge of the active segment portion 161 formed as perpendicular as possible, it is necessary to increase the ratio of the longitudinal etching to the lateral etching during the first dry etching, which specifically includes: reducing the gas flow ratio of the etching reaction, for example, when the mixed plasma of oxygen and SF6 is used, the flow rate of SF6 may be reduced, and the longitudinal etching rate may be increased; increasing the etching power, that is to say, the ability to attract electrons between the two plates of the etching chamber is increased, such that the electrons strike the layer to be etched at a faster rate, thus increasing the longitudinal etching rate; reducing the etching gas pressure, reducing the concentration of the reaction gas in the etching chamber, and slowing the lateral etching rate of the reaction gas.

After the step d, the edge of the active segment portion 161 is aligned with the edge of the island-like photoresist pattern 19 after first ashing, the width of the active segment portion 161 is reduced, thereby reducing the length of the tail of the active segment portion 161, and reducing the length of both sides of the active segment portion 161 that may be illuminated by the light, thereby further reducing the light leakage current.

Figure 7:
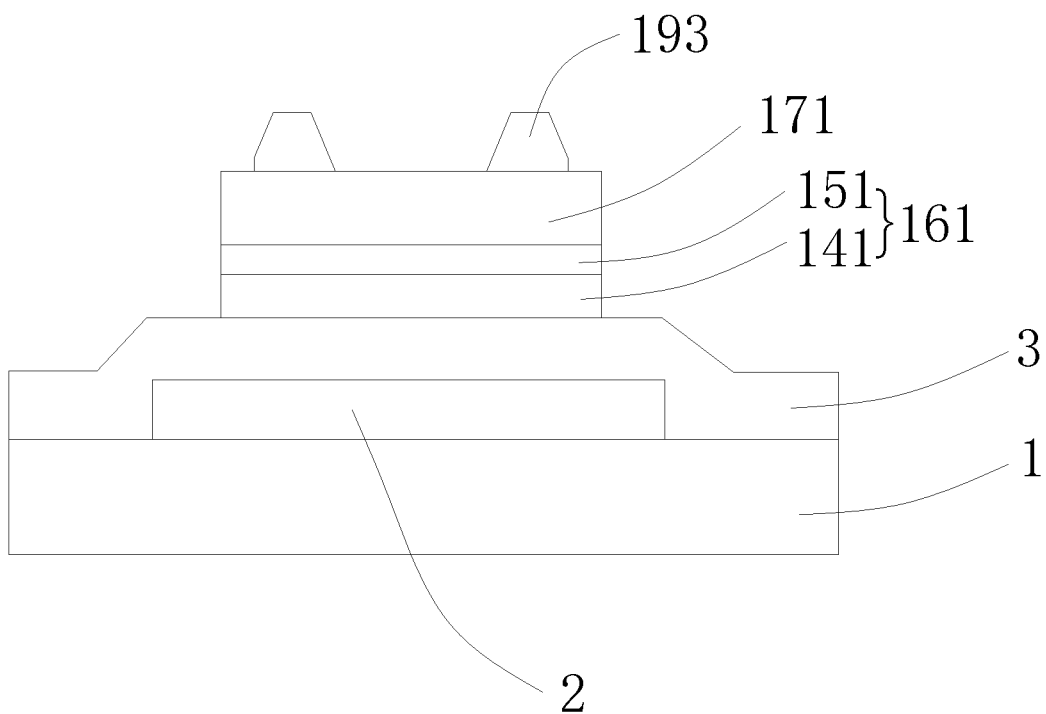
FIG. 7 is a schematic view of the step e of the method for fabricating an array substrate provided by an embodiment of the present application.

Step e, as shown in FIG. 7, performing second ashing for the photoresist pattern after first ashing, so as to obtain third portions 193 which are disposed at intervals, and a middle portion of the active segment portion 161 is exposed between the third portions 193.

Specifically, the second ashing uses a mixed gas of oxygen and a fluorine-containing gas, and the fluorine-containing gas includes at least one of NF3, CF4, C2F6, C4F8, CHF3, and SF6. The mixed gas is ionized into a plasma by a radio frequency power source, such as through a form of high voltage discharge. The first ashed island-like photoresist pattern 19 is etched by the plasma, wherein the second portion 192 having a smaller thickness is completely etched away, and the first portion 191 having a larger thickness is partially removed to form the third portion 193. The third portion 193 has a thickness smaller than the thickness of the first portion 191, and has a length smaller than the length of the first portion 191. Moreover, the third portion 193 exposes the middle portion and two ends of the active segment portion 161.

Figure 8:
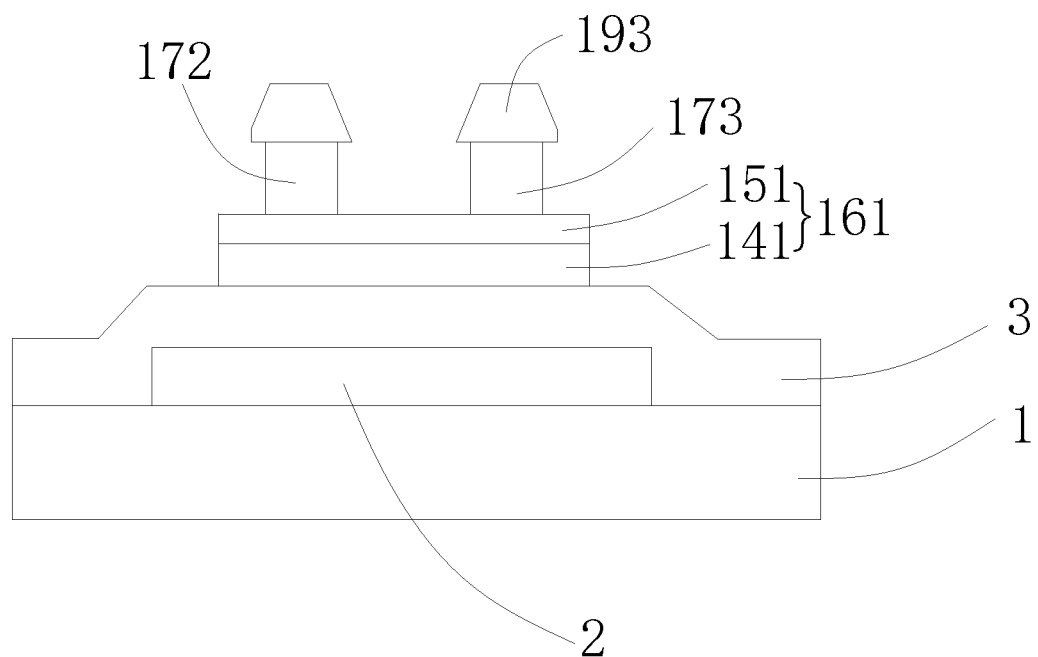
FIGS. 8 and 9 are schematic views of the step f of the method for fabricating an array substrate provided by an embodiment of the present application.
Figure 9:
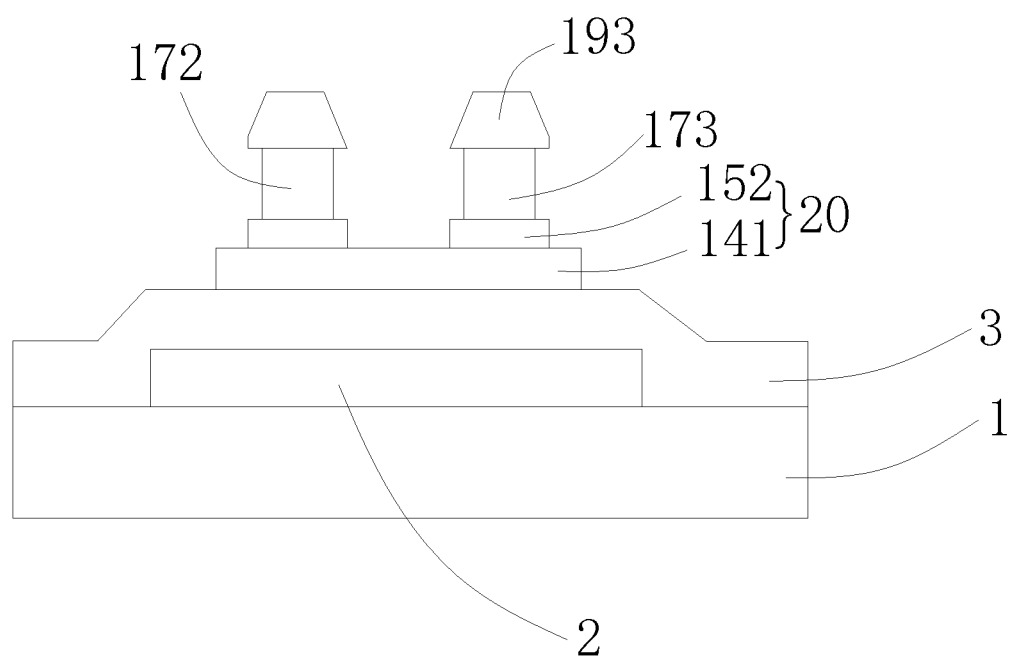

Step f, as shown in FIG. 8 and FIG. 9, performing second wet etching on the source-drain metal segment 171 by using the third portion 193 as a mask, so as to obtain a source electrode 172 and a drain electrode 173 which are disposed under the third portion 193 and inwardly indented relative to the edge of the third portion 193, and the source electrode 172 and the drain electrode 173 have an indentation distance of about 0.5 to 1.5 μm. Meanwhile, the source electrode 172 and the drain electrode 173 are also inwardly indented with respect to the edge of the active segment portion 161, and the indentation distance is approximately 0.5-1.5 μm. During the second wet etching, the inward indentation distance of the source electrode 172 and the drain electrode 173, relative to the edge of the active segment portion 161, may further be adjusted by adjusting etching time. That is to say, the smaller the inward indentation distance of the source electrode 172 and the drain electrode 173 relative to the edge of the active segment portion 161, the smaller the length of the tail of the active segment portion 161 protruding relative to the source electrode 172 and the drain electrode 173, i.e., the tail of the amorphous silicon segment 141 and the tail of the ohmic contact layers 152 are smaller, thus the amorphous silicon segment 141 and the ohmic contact layers 152 may have a larger portion to be blocked by the source electrode 172 and the drain electrode 173, thereby reducing the light leakage current generated by light exposure.

Specifically, as for the source-drain metal layer 17 in a Mo/Al/Mo, MoN/Al/Mo or Mo/Al/MoN structure, the time for the second wet etching does not exceed 150 seconds, such that the source-drain metal segment 171 may avoid being to excessively etched.

Then, performing second dry etching for the doped segment 151 in the upper layer of the active segment portion 161 by using the third portions 193 as a mask, so as to obtain ohmic contact layers 152 respectively corresponding to the two third portions 193, wherein the two sides of amorphous silicon segment 141 are in contact with the ohmic contact layers 152, which can improve the electrical contact resistance between the amorphous silicon segment 141 and the source-drain electrode 173, thereby improving the electrical characteristics of the TFT. A portion of the amorphous silicon segment 141 exposed between the ohmic contact layers 152 serves as a channel region.

The gate electrode 2, the gate insulating layer 3, the amorphous silicon segment 141, the ohmic contact layers 152, and the source electrode 172 and the drain electrode 173 collectively form a TFT, and the amorphous silicon segment 141 and the ohmic contact layers 152 are the active layer 20 of the TFT.

A portion of the edge of the amorphous silicon segment 141 that protrudes with respect to the edge of the source electrode 172 and the drain electrode 173 is referred to as a tail of the amorphous silicon, and a portion of the ohmic contact layers 152 that protrude with respect to the edge of the source electrode 172 and the drain electrode 173 is referred to as a tail of the doped layer. The length of tail of the amorphous silicon is smaller than the length of tail of the doped layer. Specifically, the length of the tail of the amorphous silicon is 1 μm to 1.6 μm, and the length of the tail of the doped layer is 0.1 μm to 0.4 μm. The length of the tail of the amorphous silicon, obtained by the method for fabricating an array substrate in the present application, is between 1 μm and 1.6 μm, which can significantly reduce the light leakage current.

Figure 10:
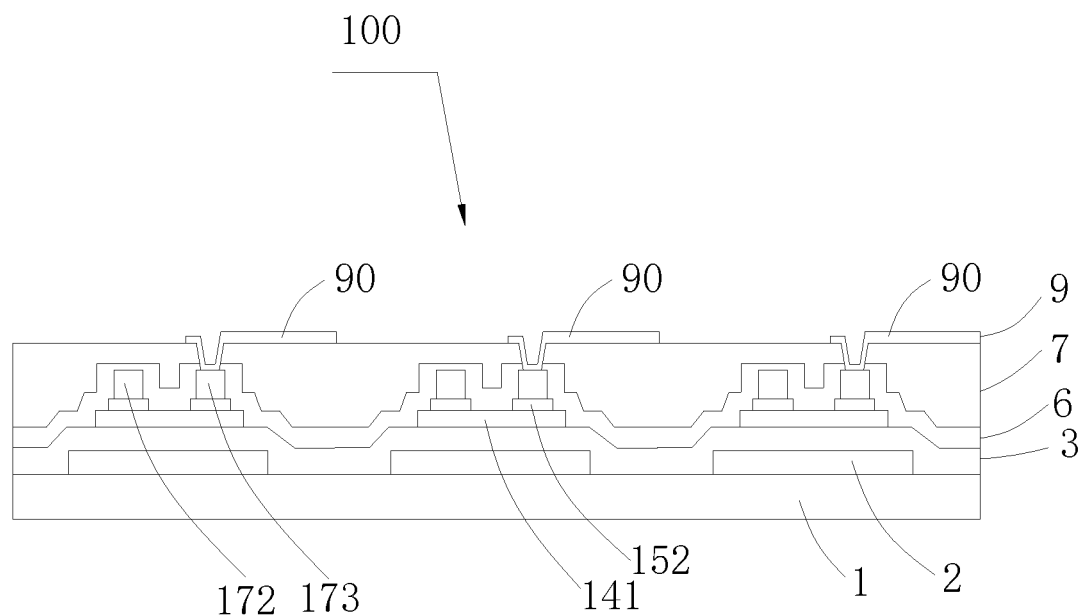
FIG. 10 is a structural schematic view of the array substrate provided by an embodiment of the present application.
Figure 11:
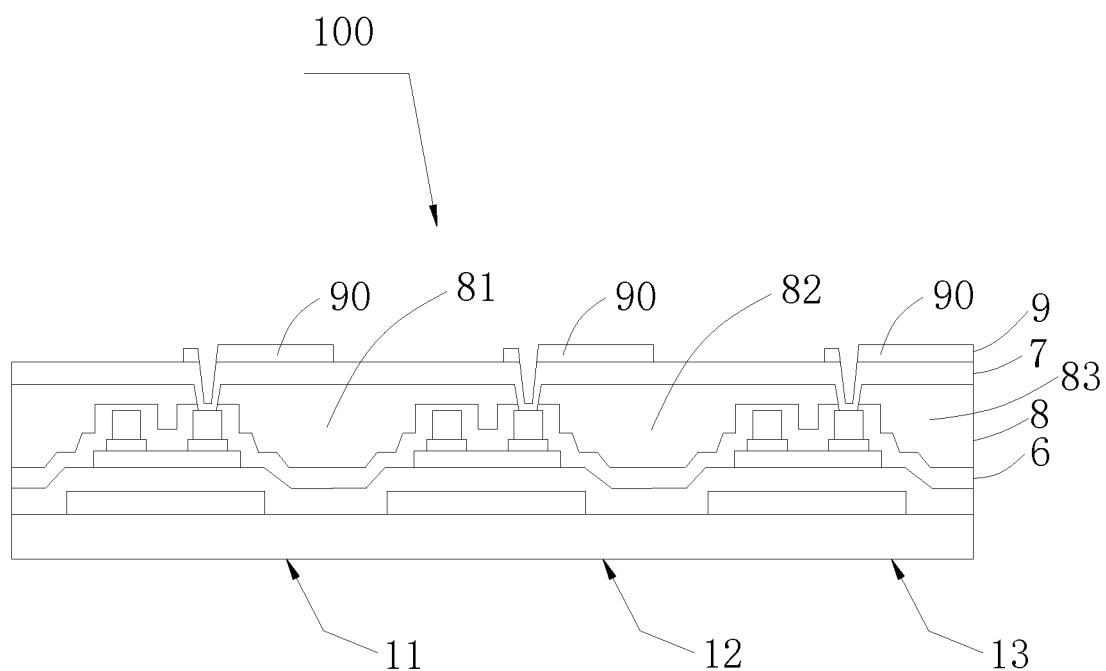
FIG. 11 is another structural schematic view of the array substrate provided by an embodiment of the present application.

The method for fabricating an array substrate provided by the present application further includes: peeling off the two third portions 193, depositing a passivation layer 6 on the TFT, forming a flat layer 7 on the passivation layer 6, and forming a pixel electrode layer 9 on the flat layer 7, wherein the pixel electrode layer 9 is connected to the drain electrodes 173 by extending through holes of the passivation layer 6 and the flat layer 7, so as to obtain an array substrate 100, as shown in FIG. 10; or includes: depositing a passivation layer 6 on the TFT, forming a color blocking layer 8 on the passivation layer 6, forming a flat layer 7 on the color blocking layer 8, and forming a pixel electrode layer 9 on the flat layer 7, wherein the pixel electrode layer 9 includes a plurality of sub-pixel electrodes 90, each of the sub-pixel electrodes 90 is connected to corresponding drain electrode 173 through by extending through holes of the passivation layer 6, the color blocking layer 8 and the flat layer 7, so as to obtain an array substrate 100 of a COA (Color on Array) type, as shown in FIG. 11, in which the color blocking layer 8 includes a red color block 81, a green color block 82 and a blue color block 83 respectively corresponding to one sub-pixel electrode 90, thus respectively forming a red sub-pixel 11, a green sub-pixel 12, and a blue sub-pixel 13.

Please refer to the following table 1, in the array substrate fabricated by the method for fabricating an array substrate provided by an embodiment of the present application, the amorphous silicons with different length of tails (a-Si tail) and the doped layers with different length of tails (N+ tail) may be obtained according to different process conditions during the fabricating process, and the present application has tested the light leakage current caused by the backlight fully open under several conditions. It can be seen that, the method for fabricating an array substrate, provided by an embodiment of the present application, may reduce the length of the tail of the amorphous silicon segment 141 by about 0.7 μm, such that the light leakage current is reduced to 6% of the light leakage current of a conventional structure, thereby effectively ensuring the stability of pixel voltages and the stability of displaying quality.

TABLE 1

Test results of light leakage currents of amorphous silicon segments and doped layers with different lengths of tails

| | Tail of the amorphous silicon segment (μm) | Tail of the doped layer (μm) | Light leakage current (A) | Light leakage current (%) |
|---|---|---|---|---|
| Conventional structure | 1.845 | 0.4812 | 1.070E−12 | 100.00% |
| Condition 1 | 1.584 | 0.368 | 4.185E−13 | 39.11% |
| Condition 2 | 1.534 | 0.347 | 6.686E−13 | 62.48% |
| Condition 3 | 1.466 | 0.253 | 1.787E−13 | 16.70% |
| Condition 4 | 1.33 | 0.159 | 6.073E−13 | 56.75% |
| Condition 5 | 1.163 | 0.130 | 6.520E−14 | 6.09% |

Among them, E is a symbol of the scientific notation.

The present application further provides an array substrate 100, which is fabricated by the method for fabricating an array substrate described in the above embodiments, as shown in FIGS. 10 and 11. The array substrate 100 is fabricated by the method for fabricating an array substrate described in the above embodiments, and includes: a substrate base layer 1, a gate electrode 2 disposed on the substrate base layer 1, a gate insulating layer 3 disposed on the substrate base layer 1 and the gate electrode 2, an amorphous silicon segment 141 disposed on the gate insulating layer 3, an ohmic contact layer 152 disposed corresponding to both sides of the amorphous silicon segment 141, a source electrode 172 and a drain electrode 173 disposed corresponding to the ohmic contact layer 152, and a pixel electrode 90 connected to the drain electrode 173.

The portion of the edge of the amorphous silicon segment 141 that protrudes with respect to the edge of the source electrode 172 and the drain electrode 173 is referred to as a tail of the amorphous silicon, and the portion of the ohmic contact layers 152 that protrude with respect to the edge of the source electrode 172 and the drain electrode 173 is referred to as a tail of the doped layer, wherein the length of the tail of the doped layer is smaller than the length of the tail of the amorphous silicon. Specifically, the length of the tail of the amorphous silicon is 1 μm to 1.6 μm, which may be reduced to about 1 μm under the best condition 5, and the length of the tail of the doped layer is 0.1 μm to 0.4 μm, which may be reduced to about 0.1 μm under the best condition 5. The tail of the amorphous silicon (a-Si tail) and the tail of the doped layer (N+ tail) of the array substrate 100 provided by the embodiments of the present application are all reduced, thereby reducing the light leakage current, and ensuring the stability of pixel voltages and the stability of displaying frames. The source electrode 172 and the drain electrode 173 are a sandwiched structure of a Mo/Al/Mo layer, a MoN/Al/Mo layer or a Mo/Al/MoN layer, and the upper layer (the Mo layer or the MoN layer, away from the amorphous silicon segment 141) has a thickness of 100-500 angstroms, the intermediate layer (the Al layer) has a thickness of 2000-5500 angstroms, and the lower layer (the Mo layer or the MoN layer, near the amorphous silicon segment 141) has a thickness of 100-300 angstroms. On the one hand, Al has advantages of good electrical conductivity and low cost, and Mo material can effectively prevent diffusion of Al atoms into the amorphous silicon segment 141, further prevent generation of the light leakage current, improve the electrical characteristics of the TFT, and prevent the diffusion of Al to the pixel electrodes 90, and prevent the performance of the transparent conductive layer from being affected.

Figure 12:
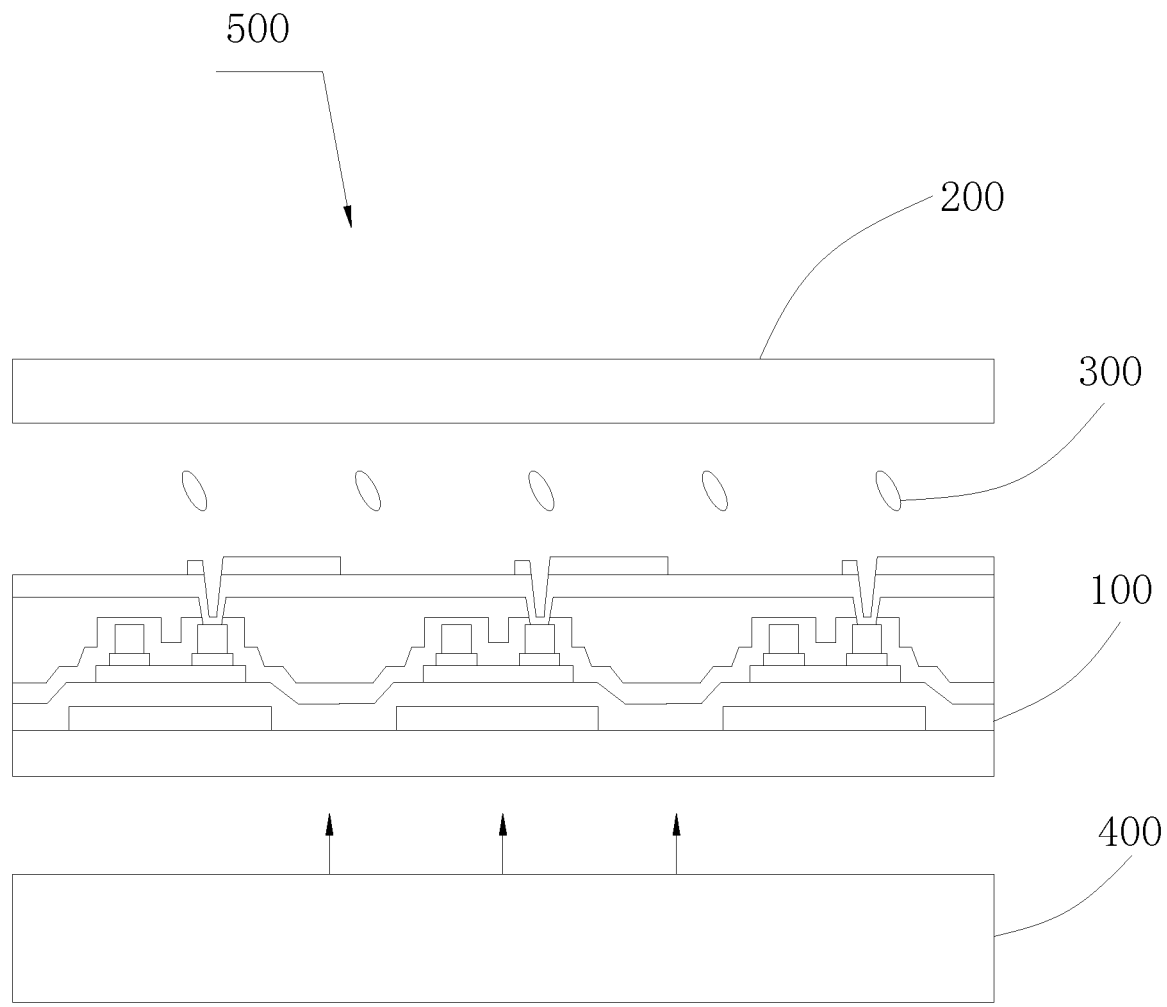
FIG. 12 is a structural schematic view of the display provided by an embodiment of the present application.

The present application further provides a display 500, as shown in FIG. 12, which includes: a liquid crystal display panel and a backlight component 400, wherein the liquid crystal display panel is formed by an array substrate 100 (as shown in FIG. 11) as described in the above embodiments, a opposite substrate 200 disposed opposite to the array substrate 100, and a liquid crystal layer 300 interposed between the array substrate 100 and the opposite substrate 200, wherein the backlight component 400 is disposed on one side of the array substrate 100 to supply light to the liquid crystal layer 300. The display 500 of the present application includes the array substrate 100 described in the above embodiments, and the tail of the amorphous silicon (a-Si tail) and the tail of the doped layer (N+ tail) of the array substrate 100 are all reduced, thereby reducing the light leakage current, and ensuring the stability of pixel voltages and the stability of displaying frames.

The above is only alternative embodiments of the present application, and is not intended to limit the present application. Various changes and modifications can be made to the present application for those skilled in the art, and any modification, equivalent substitution, improvement, etc. made within the spirit and principles of the present application should be included in the scope of the appended claims of the present application.

What is claimed is:

1. A method for fabricating an array substrate, comprising:
providing a substrate base layer, forming a gate electrode on the substrate base layer, and forming a gate insulating layer on the gate electrode and the substrate base layer;
sequentially forming a semiconductor material layer and a source-drain metal layer on the gate insulating layer, and forming an island-like photoresist pattern on the source-drain metal layer, wherein the island-like photoresist pattern comprises a first portion and a second portion disposed on both sides of the first portion, and the height of the second portion is greater than the height of the first portion; wherein the source-drain metal layer is first wet etched by using the island-like photoresist pattern as a mask, so as to obtain a source-drain metal segment;
performing first ashing, for the island-like photoresist pattern, such that the edge of the island-like photoresist pattern is aligned with the edge of the source-drain metal segment;
performing first dry etching for the semiconductor material layer by using the photoresist pattern after first ashing as a mask, so as to obtain an active segment portion;
performing second ashing for the island-like photoresist pattern after first ashing, so as to remove the first portion, and obtain third portions disposed at intervals, wherein the height of the third portions are less than the height of the first portion; and
performing second wet etching for the source-drain metal segment by using the third portions as a mask, so as to obtain a source electrode and a drain electrode.

2. The method according to claim 1, wherein the semiconductor material layer comprises an amorphous silicon layer and a doped layer formed on the amorphous silicon layer; and the active segment portion comprises an amorphous silicon segment and a doped segment disposed on the amorphous silicon segment.

3. The method according to claim 2, wherein the doped layer is an amorphous silicon layer doped with an n-type element.

4. The method according to claim 2, wherein the amorphous silicon layer has a thickness of 1000 to 4000 angstroms, and the doped layer has a thickness of 300 to 1000 angstroms.

5. The method according to claim 2, wherein, after obtaining the source electrode and the drain electrode, the method further comprises performing second dry etching for the doped segment, so as to obtain an ohmic contact layer disposed on both sides of the amorphous silicon segment.

6. The method according to claim 2, wherein the amorphous silicon layer is deposited on the gate insulating layer by chemical vapor deposition, and the doped layer is deposited on the gate insulating layer by chemical vapor deposition.

7. The method according to claim 1, wherein the first dry etching further comprises a method for increasing a ratio of rates of longitudinal etching and lateral etching.

8. The method according to claim 7, wherein the method for increasing a ratio of rates of longitudinal etching and lateral etching comprises at least one of the following steps:
reducing a ratio of a flow rate of an etching reaction gas;
improving an etching power; and
reducing etching gas pressure, and reducing concentration of reaction gas in an etching chamber.

9. The method according to claim 1, wherein the first ashing uses a mixed gas of oxygen and a fluorine-containing gas; and the fluorine-containing gas comprises at least one of NF3, CF4, C2F6, C4F8, CHF3, and SF6.

10. The method according to claim 1, wherein the second ashing uses a mixed gas of oxygen and a fluorine-containing gas; and the fluorine-containing gas comprises at least one of NF3, CF4, C2F6, C4F8, CHF3, and SF6.

11. The method according to claim 1, Wherein the material of the source-drain metal layer is at least one of chromium, molybdenum, copper, titanium, aluminum or molybdenum nitride.

12. The method according to claim 11, wherein the source-drain metal layer is a Mo/Al/Mo layer, a MoN/Al/Mo layer, or a Mo/Al/MoN layer.

13. The method according to claim 12, wherein the upper Mo layer or MoN layer has a thickness of 100-500 angstroms, the middle Al layer has a thickness of 2000-5500 angstroms, and the lower Mo layer or MoN layer has a thickness of 100-300 angstroms.

14. The method according to claim 13, wherein the time for the second wet etching does not exceed 150 seconds.

15. The method according to claim 1, wherein, after the first wet etching, the edge of the source-drain metal segment is inwardly indented by a distance of 0.5-1.5 µm with respect to the edge of the island-like photoresist pattern.

16. The method according to claim 1, wherein, after the second wet etching, the source electrode and the drain electrode obtained are inwardly indented by a distance of 0.5-1.5 µm with respect to the edge of the third portions.

* * * * *